US006670854B2

United States Patent
Takeda et al.

(10) Patent No.: US 6,670,854 B2
(45) Date of Patent: Dec. 30, 2003

(54) FRACTIONAL-N FREQUENCY SYNTHESIZER AND METHOD OF OPERATING THE SAME

(75) Inventors: Minoru Takeda, Tokyo (JP); Akira Toyama, Chigasaki (JP)

(73) Assignee: Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 10/192,796

(22) Filed: Jul. 10, 2002

(65) Prior Publication Data

US 2003/0025565 A1 Feb. 6, 2003

(30) Foreign Application Priority Data

Aug. 3, 2001 (JP) ........................................ 2001-236145

(51) Int. Cl.[7] .................................................. H03L 7/00
(52) U.S. Cl. ........................ 331/1 A; 327/156; 327/117; 331/DIG. 2; 331/16; 331/25
(58) Field of Search ............................. 331/1 A, 16, 17, 331/18, 25, 1 R, DIG. 2; 327/47, 117, 147, 156, 157, 115, 165, 167, 291; 375/376, 375; 377/48

(56) References Cited

U.S. PATENT DOCUMENTS 5,818,303 A  * 10/1998 Oishi et al. .................. 331/1 A
6,069,535 A  *  5/2000 Khlat ........................... 331/1 A
6,208,211 B1 *  3/2001 Zipper et al. ................... 331/17
6,359,950 B2 *  3/2002 Gossmann et al. ........... 375/376
6,545,548 B2 *  4/2003 Dinh et al. .................... 331/17
6,603,360 B2 *  8/2003 Kim et al. .................... 331/1 A

FOREIGN PATENT DOCUMENTS

DE          10101836 A1 *  7/2002  ............. H03L/7/00

* cited by examiner

*Primary Examiner*—Kenneth B. Wells
*Assistant Examiner*—Hai L. Nguyen
(74) *Attorney, Agent, or Firm*—Jordan and Hamburg LLP (57) ABSTRACT

A fractional-N frequency synthesizer is offered which does not produce spurious signals of periodically conspicuous spectral intensities and can cancel produced spurious signals up to a practical level even with a spurious-canceling circuit of low accuracy. The synthesizer has a sigma-delta noise shaper. The integral and fractional parts of a frequency divide ratio-setting value that frequency-divides the output signal are set. The fractional part of the frequency divide ratio-setting value is applied to the sigma-delta noise shaper every phase comparison period. The output from the noise shaper and the integral part of the frequency divide ratio-setting value are summed up to thereby produce a sum. The output signal is frequency-divided, using this sum as a frequency divide ratio. The difference between the fractional part of the frequency divide ratio-setting value and the output from the sigma-delta noise shaper is produced and accumulated in an accumulator every phase comparison period. The spurious-canceling value is produced based on the value of the accumulator.

7 Claims, 10 Drawing Sheets

PRIOR ART

FRACTIONAL-N FREQUENCY SYNTHESIZER AND METHOD OF OPERATING THE SAME

BACKGROUND OF THE INVENTION

1. Field of the Invention

The present invention relates to a PLL (phase-locked loop) frequency synthesizer and, more particularly, to a fractional-N frequency synthesizer comprising a frequency synthesizer whose frequency divide ratio is variable.

2. Description of the Related Art

Figure 7:
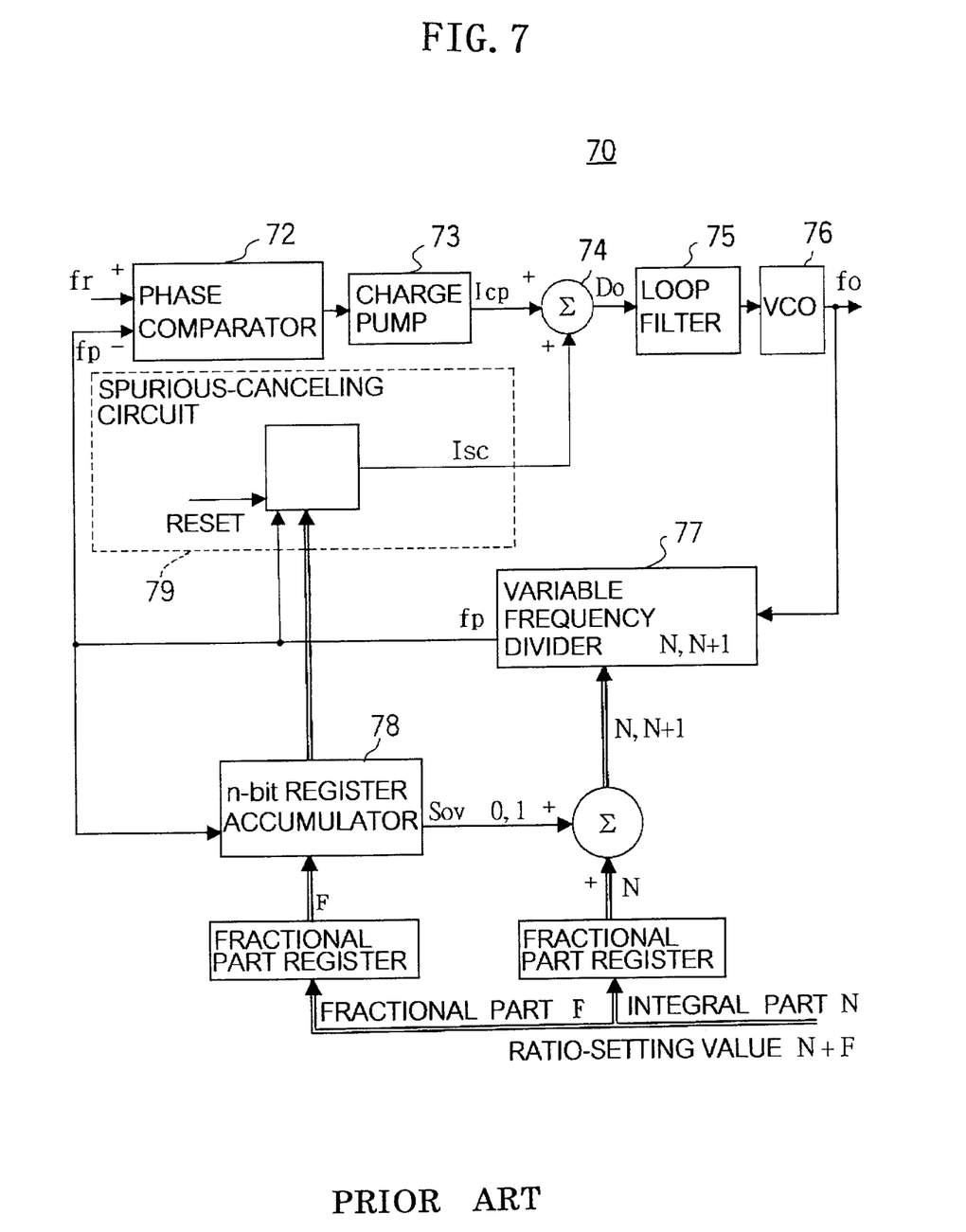
FIG. 7 is a block diagram showing the circuit of the conventional fractional-N frequency synthesizer.

A conventional fractional-N frequency synthesizer using a PLL is described, for example, in Japanese patent laid-open No. 154935/1998 (counterpart of U.S. Pat. No. 5,818, 303). This fractional-N frequency synthesizer described in this laid-open publication is shown in FIG. 7, where the conventional fractional-N frequency synthesizer is indicated by 70 and has a voltage-controlled oscillator (VCO) 76 producing an output signal of frequency fo. A part of this output signal of frequency fo is fed to a variable frequency divider 77. The frequency divider 77 and an accumulator 78 frequency-divide the signal of frequency fo by an integer N or (N+1) varying periodically, thus producing a compared signal fp. The phase difference between a reference signal frequency fr and the compared signal fp is detected by a phase comparator 72, which applies a voltage pulse having a pulse width corresponding to the phase difference to a charge pump circuit 73. This charge pump circuit 73 produces an output current Icp, which is smoothed by a loop filter 75 and converted into a voltage. This voltage is used as a control voltage for the voltage-controlled oscillator 76. Owing to this configuration, the average frequency fo of the output signal from the voltage-controlled oscillator 76 can be controlled to $$fo=fr[N+(F/2^n)]$$

where F is a value applied to the accumulator every phase comparison period (period of fr or fp) and n is an integer determined by the n-bit register structure of the accumulator. Therefore, the average frequency fo of the output signal can be switched in a frequency width smaller than the frequency fr of the reference signal by switching F as well as N.

Under this condition, however, the frequency fo of the actual output signal constantly varies periodically, producing spurious signals off the center frequency. That is, in this conventional fractional-N frequency synthesizer 70, the input value F is applied to and accumulated in the accumulator 78 of the n-bit structure every phase comparison period (period of fr or fp). The output is switched from 0 to 1 by an overflow signal Sov produced when the accumulator 78 overflows. The frequency divide ratio of the frequency divider 77 is switched from N to (N+1). Because of this structure, the frequency fo of the output signal is switched between fo1=(N+1) fr and fo2=Nfr periodically, i.e., every $(2^n/F)$ phase comparison periods. As a result, the above-described spurious signals are produced. Therefore, this conventional fractional-N frequency synthesizer 70 further includes a spurious-canceling circuit 79 to cancel out undesired spurious signals. This spurious-canceling circuit 79 produces a pulse voltage signal having a pulse width proportional to the output value of the accumulator since a timing when a reset signal is inputted to it. Another circuit is included which is driven by the pulse voltage signal and produces a spurious canceling-circuit output current Isc. This spurious-canceling current Isc and the output current Icp from the charge pump circuit 73 are added up to produce an electrical current that is smoothed by the loop filter 75 and converted into a voltage. This voltage is used as a control voltage for the voltage-controlled oscillator 76. In this way, spurious signals produced due to periodical switching of the frequency divide ratio of the variable frequency divider 77 between N and (N+1) are canceled out.

However, spurious signals from the conventional fractional-N frequency synthesizer 70 shown in FIG. 7 are essentially produced by the structure in which the frequency divide ratio of the variable frequency divider 77 is periodically switched between N and (N+1) by the accumulator 78 of n-bit register structure. As a result, a spectrum of periodically conspicuous intensity occurs. For example, in FIG. 3, as shown in a spectrum 31, in a simulation where no spurious cancellation is performed under conditions of a reference frequency fr=1 MHz and a frequency divide ratio of 315(N)+15/16, the output signal from the conventional fractional-N frequency synthesizer 70 produces a spurious signal 32 of level of −10 dB at maximum. As a result, the conventional fractional-N frequency synthesizer 70 has the problem that spurious signal cannot be reliably canceled unless the accuracy of the spurious-canceling circuit is increased. For example, where the spurious cancellation accuracy error is set to 5%, for example, using the same simulation as in FIG. 3, the maximum spectrum of spurious signals 42 produced by the conventional fractional-N frequency synthesizer 70 is about −36 dB, as in a spectrum 41 shown in FIG. 4. That is, practical results are not produced. Consequently, the conventional fractional-N frequency synthesizer 70 needs an accurate spurious-canceling circuit. Hence, the circuit is made expensive.

SUMMARY OF THE INVENTION

It is an object of the present invention to provide a fractional-N frequency synthesizer free of the foregoing problems and a method of operating the synthesizer.

This object is achieved by a method of operating a fractional-N frequency synthesizer in accordance with the present invention, the method starting with preparing a sigma-delta noise shaper. The integral and fractional parts of a frequency divide ratio-setting value for frequency-dividing the output signal are set. The fractional part of the frequency divide ratio-setting value is applied to the sigma-delta noise shaper every phase comparison period. The output from the sigma-noise shaper and the integral part of the frequency divide ratio-setting value are summed up. Using the resulting sum as a frequency divide ratio, the output signal is frequency-divided. The difference between the fractional part of the frequency divide ratio-setting value and the output from the sigma-delta noise shaper is produced. This difference is accumulated in the accumulator every phase comparison period. A spurious-canceling value is produced based on the accumulator's value.

In this method according to the invention, where a general third-order sigma-delta noise shaper is used as the above-described sigma-delta noise shaper, for example, a transfer function indicating the relation between the quantized output Y from the third-order sigma-delta noise shaper and input X is given by $Y=X+(1-z^{-1})^3 Nq$, where $z^{-1}$ indicates sampling delay and Nq indicates quantization noise. The quantization noise Nq is almost random in nature, i.e., white noise. Accordingly, if number F indicating the fractional part of the frequency divide ratio-setting value is applied to the third-order noise shaper every phase comparison period, a random integer sequence S whose average value is equal to the fractional part F of the frequency divide ratio-setting value is produced every phase comparison period. That is, almost random integer sequence S whose average value is F is produced, the sequence S being from −3 to +4.

The output from this sigma-delta noise shaper and the integral part N of the frequency divide ratio-setting value are summed up. A sequence of almost random integers is produced. The average value of this sequence is equal to N+F. The sequence is from N−3 to N+4. This random sequence is used as a frequency divide ratio in the fractional-N frequency synthesizer. An output signal fo having a frequency that is (N+F) times as high as the reference frequency fr on average is produced. Therefore, in the sigma-delta noise shaper of the present invention, the frequency divide ratio does not vary periodically, unlike the conventional method of operating a fractional-N frequency synthesizer, because an almost random integer sequence S whose average value is equal to F is produced, the sequence S being from −3 to +4, for example. For this reason, generation of spurious signals having periodically conspicuous spectral intensities as encountered with the prior art technique is avoided.

In this way, in the fractional-N frequency synthesizer according to the present invention, spurious signals having periodically conspicuous spectral intensities are not produced. With respect to randomly generated spurious signals, the difference between the fractional part of the frequency divide ratio-setting value and the output from the sigma-delta noise shaper is created. This difference is accumulated in the accumulator every phase comparison period. A spurious-canceling value is produced based on the value of the accumulator. Thus, spurious suppression is performed.

In the fractional-N frequency synthesizer according to the present invention, spurious signals of periodically conspicuous spectral intensities are not produced. Therefore, produced spurious signals can be canceled up to a practical level even if the spurious-canceling circuit is not accurate.

A method as set forth in claim 2 of the invention is based on the method described above and further characterized in that there are further steps of converting the output from the accumulator into an analog value and adding the analog value to the output from a phase comparator that produces the phase difference between an output signal and a reference signal, the output signal being frequency-divided by the frequency divide ratio.

In the method according to the invention including these steps, a value indicative of the difference between the fractional part of the frequency divide ratio-setting value and the output from the sigma-delta noise shaper corresponds to the error between the frequency divide ratio and the frequency divide ratio-setting value every phase comparison period. This error is accumulated in the accumulator. The output from the accumulator is converted into an analog value. This analog value is added to the output from the phase comparator as a spurious-canceling value. Thus, the error in the frequency divide ratio is compensated. As a consequence, produced spurious signals are canceled.

A method as set forth in claim 3 of the invention is based on the method as set forth in claim 2 and further characterized in that timing at which the output from the accumulator that is analog converted using the period of the output signal is produced is limited to a range close to the output timing of the phase comparator.

In the method according to the invention having the features described above, the timing at which the spurious-canceling value is added is limited to the range closest to the output of the phase comparator, utilizing the period of the output signal frequency. This prevents deviation between the output timing of the phase comparator and the output timing of the spurious-canceling circuit so that spurious signals being caused by such the deviation are suppressed.

Claim 4 of the present invention provides a fractional-N frequency synthesizer having a voltage-controlled oscillator, a phase comparator, and a variable frequency divider mounted between the voltage-controlled oscillator and the phase comparator. This frequency synthesizer comprises: means for setting the integral and fractional parts of a frequency divide ratio-setting value for frequency-dividing the output signal from the voltage-controlled oscillator by the variable frequency divider; a sigma-delta noise shaper to which the fractional part of the frequency divide ratio-setting value is applied every phase comparison period; and adder means for summing up the output from the sigma-delta noise shaper and the integral part of the frequency divide ratio-setting value to thereby produce a sum. The output from the adder means is used as a frequency divide ratio by the variable frequency divider, which in turn frequency-divides the output signal from the voltage-controlled oscillator. The frequency-divided output signal is supplied to the phase comparator.

In the fractional-N frequency synthesizer of this structure, the sigma-delta noise shaper randomly produces a frequency divide ratio which is an integer and whose average value is equal to the frequency divide ratio-setting value. This frequency divide ratio is fed to the variable frequency divider. Therefore, spurious signals of periodically conspicuous spectral intensities are not essentially produced, unlike the conventional fractional-N frequency synthesizer. Consequently, produced spurious signals can be canceled up to a practical level even if the spurious-canceling circuit is not accurate. Hence, a fractional-N frequency synthesizer can be constructed relatively economically.

Claim 5 of the invention provides a fractional-N frequency synthesizer which is based on the fractional-N frequency synthesizer as set forth in claim 4 and further characterized in that it further includes: means for creating the difference between the fractional part of the frequency divide ratio-setting value and the output from the sigma-delta noise shaper; means for accumulating the difference every phase comparison period; and means for producing a spurious-canceling value based on the accumulated value.

The fractional-N frequency synthesizer of this structure contains the spurious-canceling circuit of relatively simple construction as described above. Therefore, produced spurious signals can be effectively canceled. That is, in the present invention, spurious signals of periodically conspicuous spectral intensities are not produced essentially. In consequence, produced spurious signals can be canceled up to a practical level even with a spurious-canceling circuit of a simple structure.

Claim 6 of the invention provides a fractional-N frequency synthesizer which is based on the fractional-N frequency synthesizer as set forth in claim 5 and further characterized in that the means of the spurious-canceling circuit for producing the spurious-canceling value further includes means for limiting a timing to produce spurious-canceling value to a range close to the output timing of the phase comparator based on the period of the output signal from the voltage-controlled oscillator and adder means for adding the produced spurious-canceling value to the output from the phase comparator.

In the fractional-N frequency synthesizer of this structure, the output timing of the phase comparator and the timing at which the spurious-canceling value is added are restricted to a very close range by utilizing the period of the output signal frequency. This prevents deviation between the output timing of the phase comparator and the output timing of the canceling circuit so that spurious signals being caused by such the deviation are suppressed.

Claim 7 of the invention provides a fractional-N frequency synthesizer which is based on the fractional-N frequency synthesizer as set forth in claim 4 and further characterized in that there are further provided a random number generator and adder means for adding up the output from the random number generator and the output from the means for setting the fractional part of the frequency divide ratio-setting value. The output from the adder means is applied to the delta-sigma noise shaper.

In the fractional-N frequency synthesizer of this structure, the randomness of the output from the sigma-delta noise shaper is enhanced further. Generation of spurious signals having periodically conspicuous spectral intensities is suppressed further.

DESCRIPTION OF THE PREFERRED EMBODIMENTS

Embodiments of the present invention are hereinafter described in detail with reference to the drawings.

Figure 1:
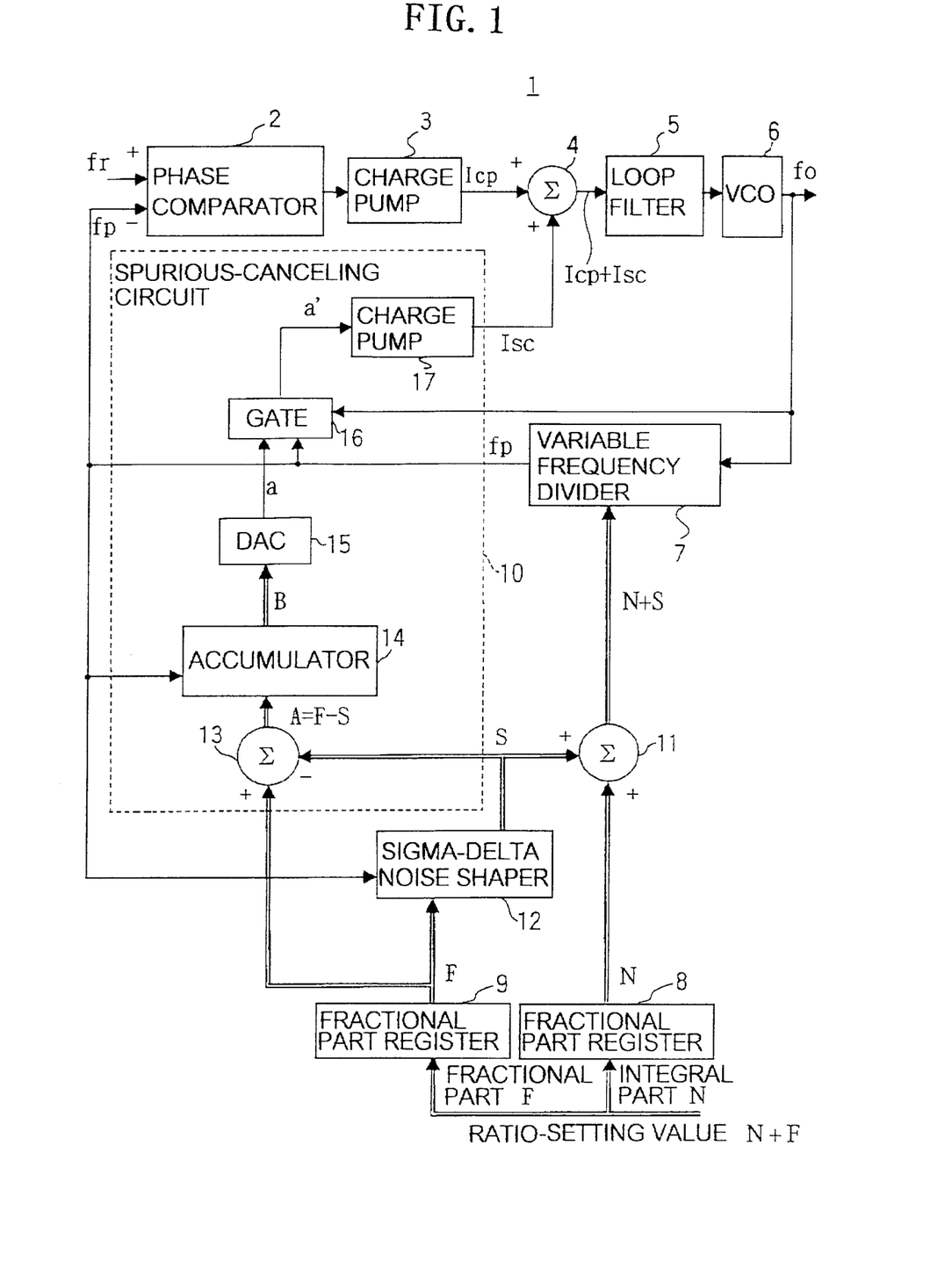
FIG. 1 is a block diagram showing the circuit of a fractional-N frequency synthesizer according to a first embodiment of the present invention.

FIG. 1 shows a fractional-N frequency synthesizer, 1, according to a first embodiment of the present invention.

This fractional-N frequency synthesizer 1 of this embodiment has a phase comparator 2 and a charge pump 3. A reference frequency signal fr is applied to one input terminal of the comparator 2, while a phase-compared signal fp is applied to the other input terminal. The phase comparator 2 produces an output proportional to the phase difference between the signals fr and fp. The charge pump 3 produces a charge pump output current Icp that assumes any one of three states, i.e., delivery of an electrical current, suction of an electrical current, and a high-impedance state, depending on the output from the phase comparator 2. This charge pump output current Icp is applied to a loop filter 5 through an adder 4. The current is smoothed and converted into a voltage that becomes a control voltage for a voltage-controlled oscillator 6. A part of the output signal (frequency) fo from the voltage-controlled oscillator 6 is fed back to a variable frequency divider 7.

A frequency divide ratio is applied to the variable frequency divider 7. The frequency fo of the output signal from the voltage-controlled oscillator 6 is frequency-divided by this frequency divide ratio. In particular, if the frequency divide ratio is an integer N, a frequency-divided, phase-compared signal fp of fo/N is produced. In this way, the frequency-divided, phase-compared signal fp is compared against the reference frequency signal fr by the phase comparator 2. An output based on the phase difference between the signals fr and fp is produced. In consequence, the frequency fo of the output signal from the voltage-controlled oscillator 6 is controlled to N times the reference frequency fr, i.e., fo=N fr. To lock the frequency fo of the output signal from the voltage-controlled oscillator 6 to the fo=N fr as quickly as possible, it is necessary to set the frequency fr of the reference signal as high as possible. However, if fr is set higher, inconveniences of having a fewer number of output frequencies fo=N fr capable of being produced within a given frequency band will arise.

For this reason, a fractional-N frequency synthesizer has been devised which produces an output signal having a frequency that is (N+F) times the reference frequency fr as the frequency divide ratio consisting of an integer N to which a fractional part F is added (N+F), i.e., the frequency of the output signal is fo=(N+F) fr. In the prior art technique described above, the frequency divide ratio is periodically varied from N to (N+1) at certain intervals to produce this fractional part F. As an average value, (N+F) is produced. In consequence, spurious signals having periodically conspicuous spectral intensities are produced.

In this embodiment of the invention, there are an integral part register 8 and a fractional part register 9 for storing the integral part N and the fractional part F, respectively, of the frequency divide ratio-setting value. The integral part N of the contents of the integral part register 8 is applied as the frequency divide ratio of the variable frequency divider 7 through an adder 11. The fractional part F of the contents of the fractional part register 9 is supplied as the input to the third-order sigma-delta noise shaper 12, for example.

Figure 2:
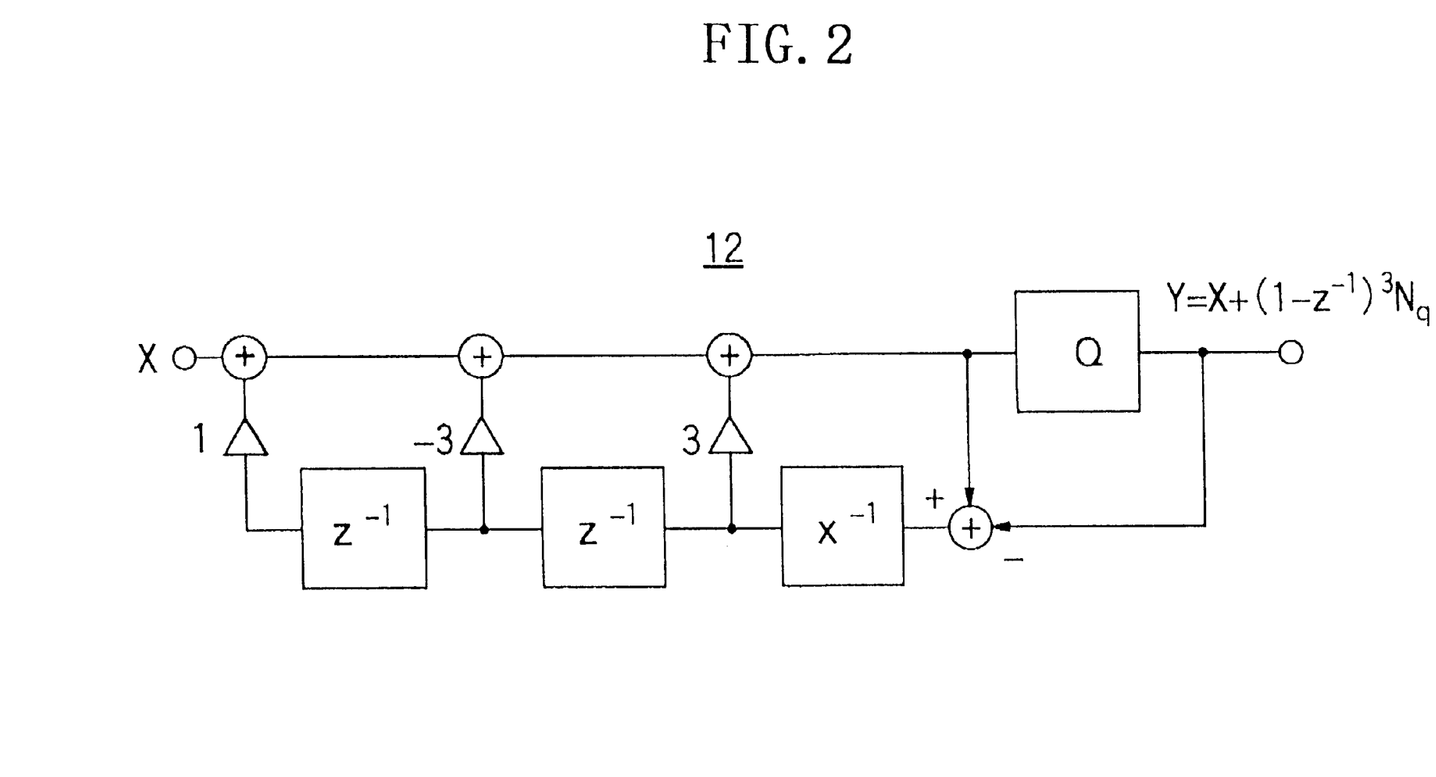
FIG. 2 is a block diagram schematically showing a sigma-delta noise shaper used in the fractional-N frequency synthesizer shown in FIG. 1.

As shown in FIG. 2, with respect to the third-order sigma-delta noise shaper 12, the relation of the output Y to the input X is given by the following transfer function:

$$Y = X + (1-z^{-1})^3 Nq$$

where $z^{-1}$ indicates one sampling delay and Nq indicates quantization noise. The quantization noise Nq has randomness (white noise). Therefore, if number F indicative of the fractional part of the frequency divide ratio-setting value is applied to the third-order sigma-delta noise shaper 12 every phase comparison period, a random integer sequence S of −3 to +4 having an average value equal to the fractional part F of the frequency divide ratio-setting value is delivered every phase comparison period. The frequency-divided, phase-compared signal fp is applied as a clock signal to the third-order sigma-delta noise shaper 12.

The adder 11 produces the sum (N+S) of the output S from the sigma-delta noise shaper 12 and the integral part N of the frequency divide ratio-setting value. The substantially random integer sequence S of N−3 to N+4 having an average value equal to (N+F) is delivered. This random number is used as the frequency-divide ratio of the variable frequency divider 7. The fractional-N frequency synthesizer 1 produces an output signal fo=(N+F) fr having a frequency that is (N+F) times the reference frequency fr on average. In this way, the sigma-delta noise shaper 12 of the invention produces the substantially random integer sequence S of −3 to +4, for example, whose average value is equal to F. Consequently, periodic variations in the frequency divide ratio do not occur, unlike the method of operation of the conventional fractional-N frequency synthesizer.

Figure 3:
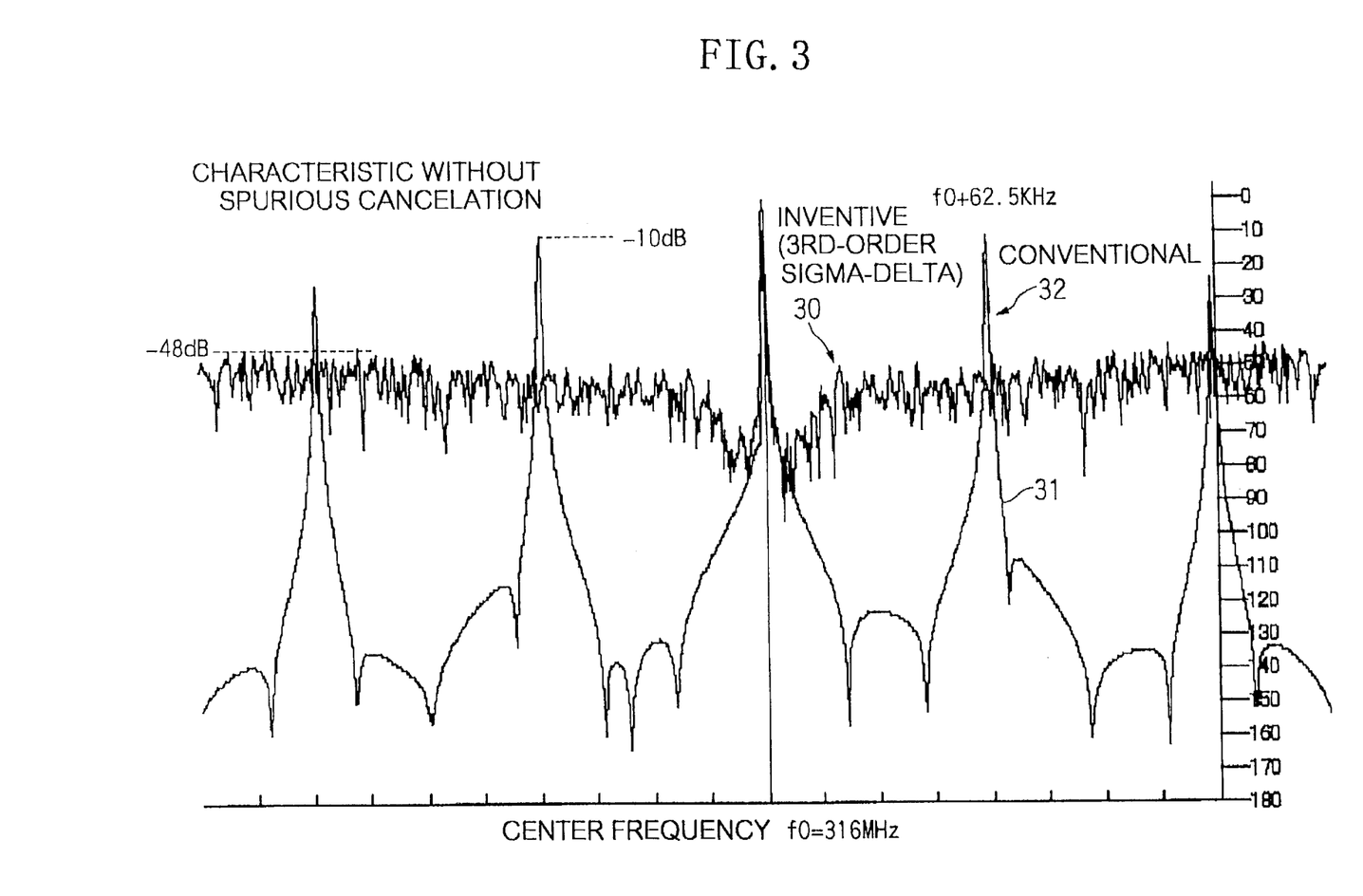
FIG. 3 is a graph in which frequency is plotted on the horizontal axis and the relative magnitude of output is on the vertical axis, comparing the intensity of the output signal from a fractional-N frequency synthesizer according to an embodiment of the invention against the intensity of the output signal from a conventional fractional-N frequency synthesizer in a simulation where spurious cancellation is not conducted.

As a result, in a simulation where spurious cancellation as shown in FIG. 3 is not performed (i.e., in the waveform 30 of the output signal from the fractional-N frequency synthesizer 1 of the invention under conditions of reference frequency fr =1 MHz and frequency divide ratio 315 (N)+ $^{15}/_{16}$(F)), generation of spurious signals 32 (−10 dB at maximum) having periodically conspicuous spectral intensities as in the output waveform 31 from the conventional fractional-N frequency synthesizer is circumvented. In this embodiment using the third-order sigma-delta noise shaper, spurious spectra are dispersed and spread. Therefore, the maximum level is suppressed to within about −48 dB. In this way, the difference in level between maximum spurious signal intensity in the prior art technique and the maximum spurious signal intensity according to the invention is as large as 38 dB. It follows that the accuracy requirements placed on spurious-canceling circuits for them differ by an amount corresponding to the level difference. The sigma-delta noise shaper 12 is not limited to the third-order type. It may also be a first-, second-, or higher-order sigma-delta noise shaper.

Figure 4:
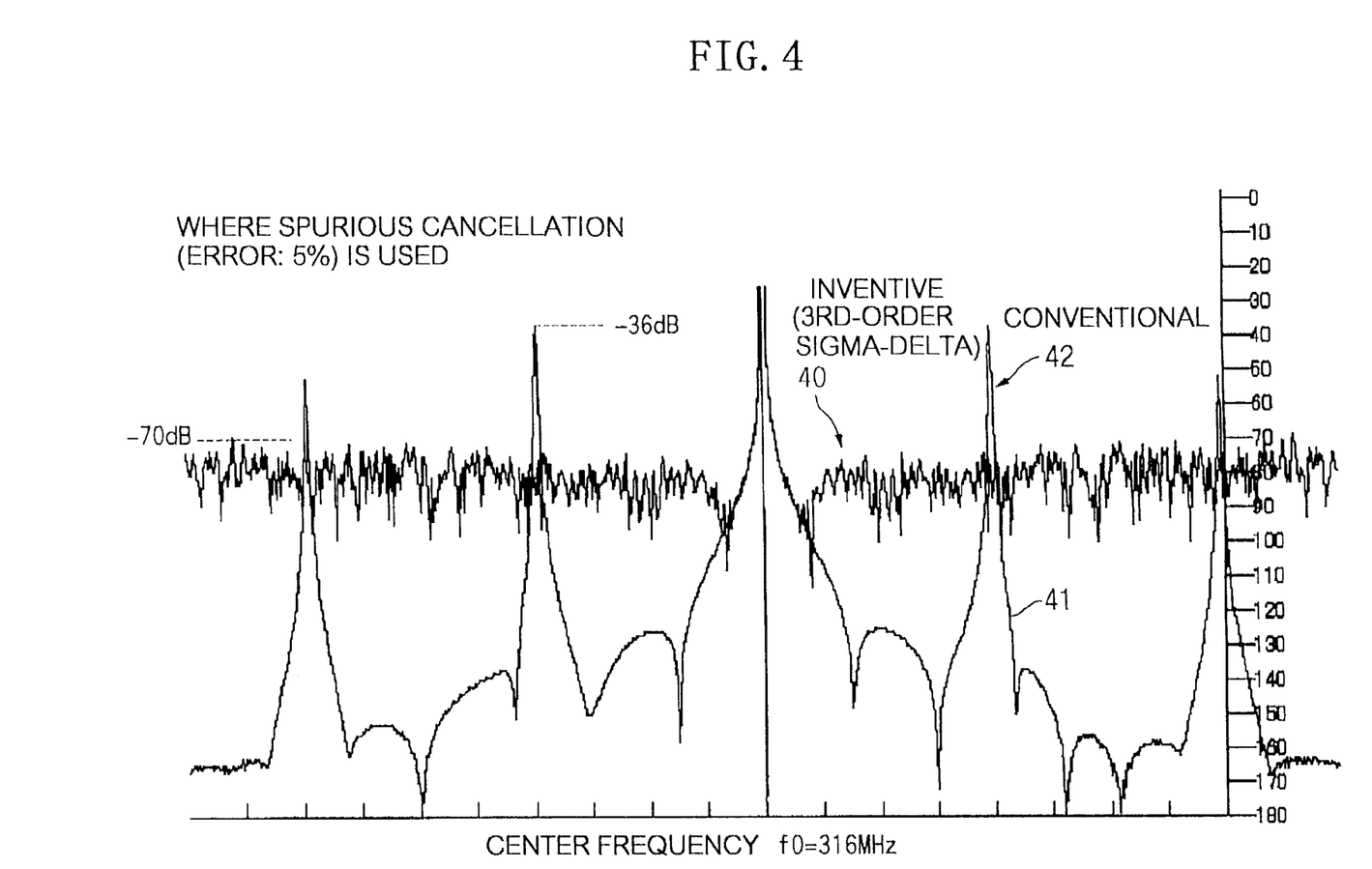
FIG. 4 is a graph in which frequency is plotted on the horizontal axis and the relative magnitude of output is on the vertical axis, comparing the intensity of the output signal from a fractional-N frequency synthesizer according to an embodiment of the invention against the intensity of the output signal from a conventional fractional-N frequency synthesizer in a simulation where spurious cancellation is conducted with cancellation accuracy error of 5%.

As described previously, the output signal from the inventive fractional-N frequency synthesizer 1 using the sigma-delta noise shaper 12 is indicated by output waveform 30 shown in FIG. 3. Where no spurious cancellation is performed, this output signal has spurious signals of relatively low levels dispersed around the center frequency fo. Since spurious signals 32 having conspicuous spectral intensities are not present unlike the output waveform 31 of the prior art technique, if the accuracy error of the spurious-canceling circuit is set to 5% using the same simulation as in FIG. 3 to cancel spurious signals in the present invention, the magnitudes of spurious signals in the output waveform 40 from the fractional-N frequency synthesizer 1 of the invention are approximately less than −70 dB as shown in FIG. 4. In this way, practically acceptable results are obtained. That is, as mentioned previously, the fractional-N frequency synthesizer 1 of the present invention is fit for practical use even if an accurate spurious-canceling circuit is not used.

An embodiment of a spurious-canceling circuit 10 used in the fractional-N frequency synthesizer 1 of the invention is next described by referring again to FIG. 1. This spurious-canceling circuit 10 has a subtractor 13 and an accumulator 14. The subtractor 13 subtracts the output S from the sigma-delta noise shaper 12 from the contents F of the fractional part register 9 and produces their difference A=(F−S). The accumulator 14 accumulates the difference A every phase comparison period. The differential output A=(F−S) from the subtractor 13 indicates the error between the true frequency divide ratio-setting value (N+F) including a fractional part and the actual integral frequency divide ratio (N+S) of the variable frequency divider 7. A frequency-divided, phase-compared signal fp is applied as a clock signal to the accumulator 14. The output signal B from this accumulator 14 is converted into an analog value a by a digital-to-analog converter 15. The output a from this digital-to-analog converter 15 is supplied to a charge pump 17 via a gate 16.

A spurious-canceling value is output in synchronism with the output timing of the phase comparator 2 and added to the output from the phase comparator 2 to cancel spurious signals. For this purpose, the gate 16 receives the frequency-divided output fp from the variable frequency divider 7 in order to open the gate in synchronism with the frequency-divided, phase-compared output fp from the variable frequency divider 7. As mentioned previously, the contents A of the accumulator 14 indicate the error (F−S) between the true frequency divide ratio-setting value (N+F) and the actual frequency divide ratio (N+S). The actual frequency divide ratio is corrected using this error. Thus, the output from the phase comparator 2 is compensated to its correct value. Therefore, a synchronization to the output timing of the phase comparator 2 is performed.

Furthermore, the gate 16 receives the output signal fo from the voltage-controlled oscillator 6 and opens the gate 16 only during one period of the output signal fo immediately after the frequency division output fp from the variable frequency divider 7. During this interval, a spurious-canceling value a' corresponding to the output a from the digital-to-analog converter 15 is produced. This prevents generation of spurious signals if the output timing of the spurious-canceling circuit 10 persists longer than the output timing of the phase comparator 2, electric charge that cannot be canceled is produced, and a temporal voltage variation occurs to thereby shift the oscillation frequency fo of the voltage-controlled oscillator 6.

The charge pump 17 delivers the charge pump output current Isc in proportion to the output a' from the gate 16 corresponding to the output a from the digital-to-analog converter 15. The output current Isc assumes any one of the three states, i.e., delivery of an electrical current, suction of an electrical current, and a high-impedance state. This charge pump output current Isc and the charge pump output current Icp corresponding to the output from the phase comparator 2 are summed up by the adder 4, which produces a sum output (Icp+Isc). This value (Icp+Isc) acts as a voltage controlling the output fo from the voltage-controlled oscillator 6 via the loop filter 5.

Figure 5A:
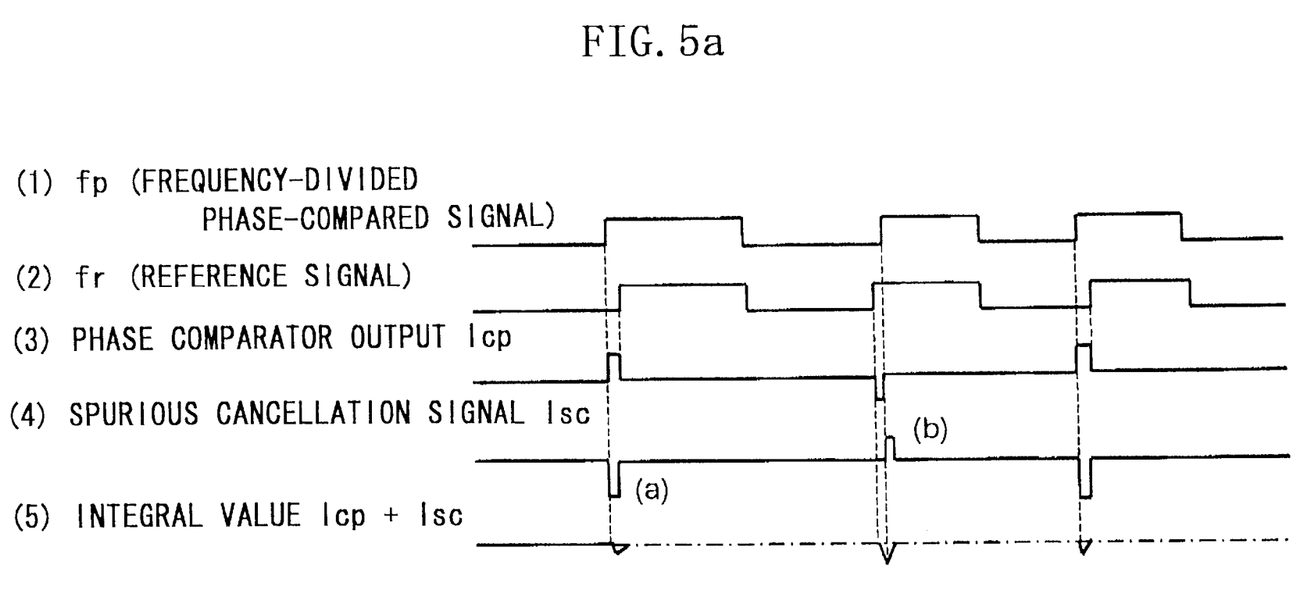
FIG. 5a is a timing diagram illustrating the operation of a spurious-canceling circuit of the present invention.

The operation timing of the above-described spurious-canceling circuit 10 of the invention is described in further detail by comparison with the conventional example by referring to FIGS. 5a–5d. As shown in FIG. 5a, the phase-compared signal fp(1) frequency-divided by the variable frequency divider 7 for phase comparison is compared with the reference signal fr(2) in terms of phase in the phase comparator 2, and an output corresponding to the phase difference between the signals fp and fr is produced. The charge pump circuit 3 produces the signal Icp(3) corresponding to the output from the phase comparator 2. Meanwhile, the spurious-canceling circuit 10 places a value B for compensating the frequency divide ratio (N+S) into the accumulator 14. This value B is converted into an analog value a, which is supplied to the charge pump 17 via the gate 16 substantially at the timing at which the frequency-divided, phase-compared signal fp rises, thus producing a spurious-canceling signal Isc(4). This spurious-canceling signal Isc(4) and the output signal Icp(3) from the phase comparator 2 are added up by the adder 4 and integrated with respect to time by the loop filter 5. The output (5) from this loop filter is shown at the lowest stage of FIG. 5a. This output signal(5) from this loop filter is a voltage controlling the output signal fo from the voltage-controlled oscillator 6 as described previously. Note that (a) close to the spurious-canceling signal Isc(4) of FIG. 5a shows a case where the frequency-divided, phase-compared signal fp leads the reference signal fr in phase, while (b) shows a case where the frequency-divided, phase-compared signal fp lags the reference signal fr in phase.

Figure 5B:
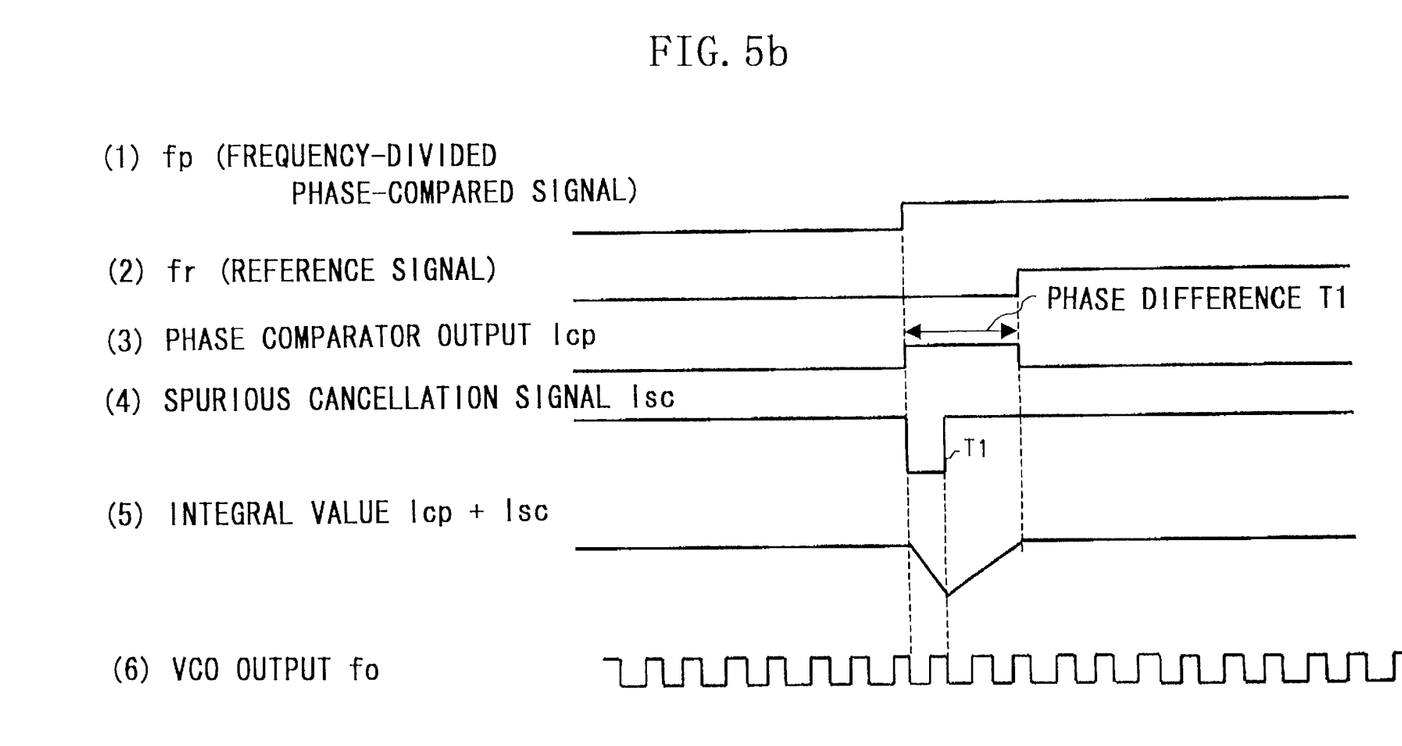
FIG. 5b is a timing diagram showing portion (a) of FIG. 5a to a magnified scale.
Figure 5C:
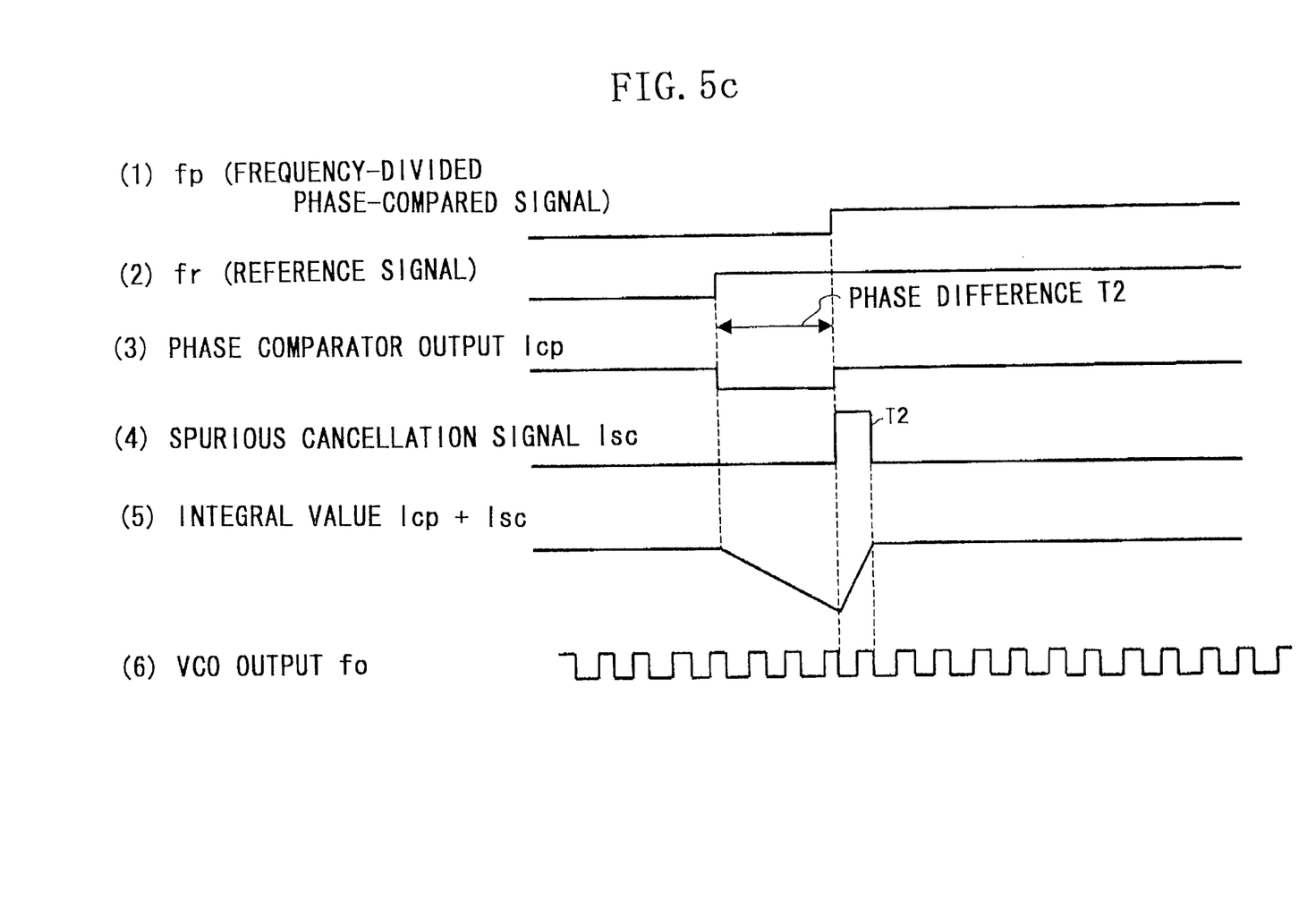
FIG. 5c is a timing diagram showing portion (b) of FIG. 5a to a magnified scale.

FIG. 5b is a time-expanded timing diagram of the portion (a) of FIG. 5a. FIG. 5c is a time-expanded timing diagram of the portion (b) of FIG. 5a. As shown in the timing diagrams of FIGS. 5b and 5c, the output signal Icp(3) from the phase comparator 2 indicative of the phase difference T1 or T2 between the signals fp and fr is added to the spurious-canceling signal Isc(4) indicated by pulse T'1 or T'2 and integrated with respect to time by the loop filter 5. In this way, the output signal(5) is created. The spurious-canceling signal Isc(4) indicated by pulse T'1 or T'2 is produced only during one period of the output, signal fo(6) from the voltage-controlled oscillator 6. The total amount of charge owing to the current Isc(4) cancels the spurious portion of the charge due to the current Icp(3). Therefore, in FIG. 5b, when the output Icp ends, the cancellation ends completely. In FIG. 5c, when the output Isc ends, the cancellation ends completely.

Figure 5D:
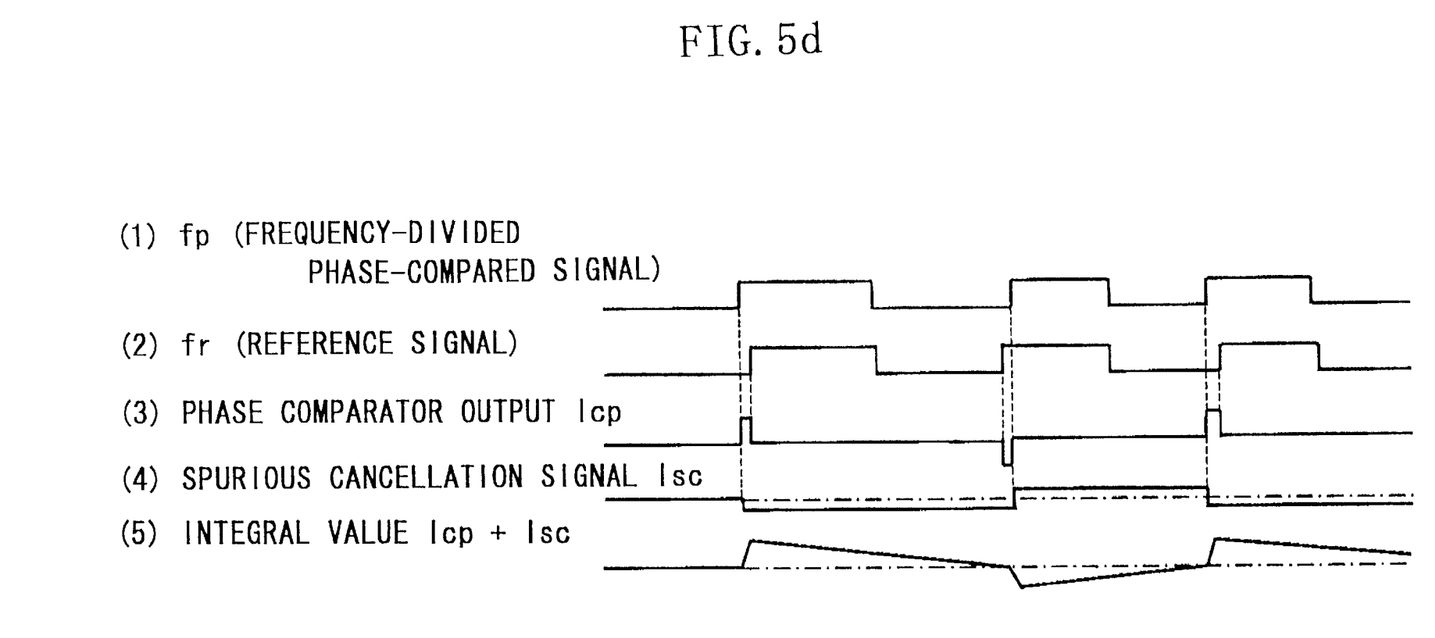
FIG. 5d is a timing diagram illustrating the operation of a conventional spurious-canceling circuit.

On the other hand, FIG. 5d is a diagram showing the timing of a conventional, typical spurious-canceling circuit. As can be seen from this FIG. 5d, a spurious-canceling signal Isc(4)' is produced over one whole period of the frequency-divided, phase-compared signal fp. Therefore, the output signal Icp(3) from the phase comparator and the accumulated value(5)' of the spurious-canceling signal Isc (4)' do not converge until one period of the frequency-divided, phase-compared signal fp elapses. As a result, control of the voltage-controlled oscillator relying on this value(5)' delays, deteriorating the accuracy.

Figure 6:
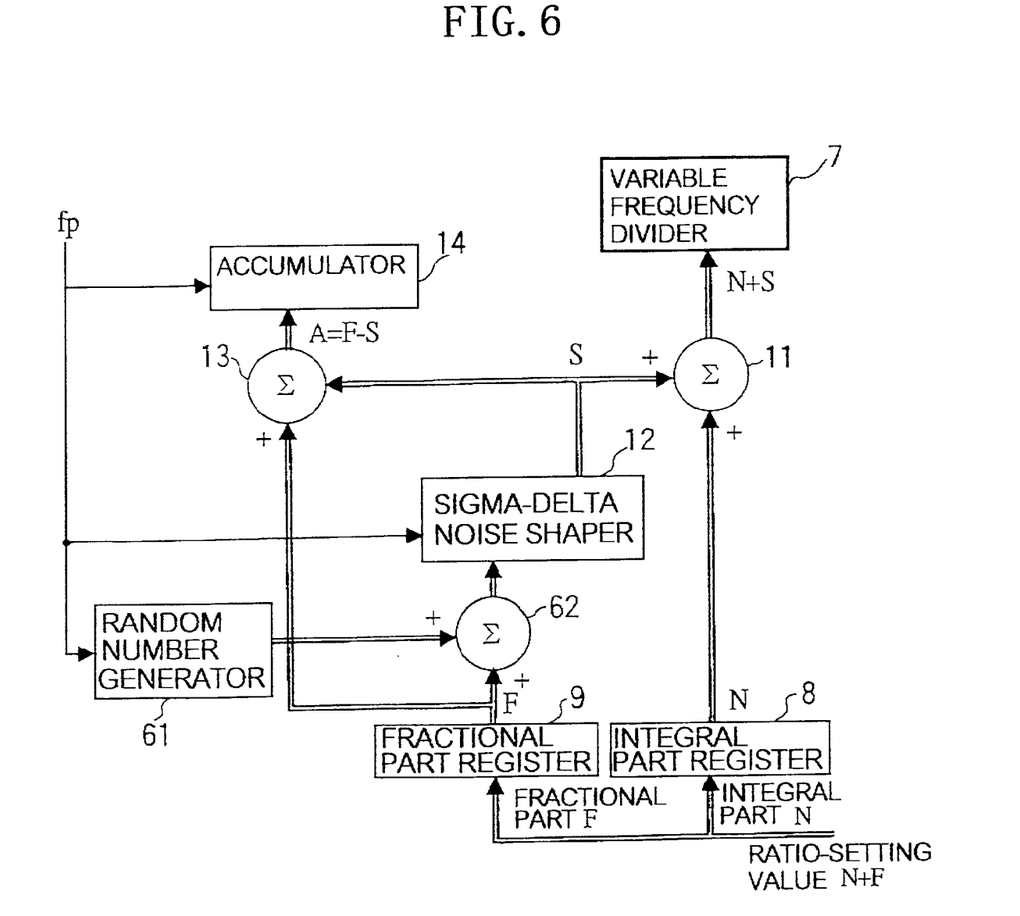
FIG. 6 is a block diagram showing main portions of a fractional-N frequency synthesizer according to a second embodiment of the invention.

FIG. 6 is a diagram showing main portions of a fractional-N frequency synthesizer according to another embodiment of the present invention. Those parts which are the same as their counterparts of the fractional-N frequency synthesizer of the first embodiment of the invention shown in FIG. 1 are indicated by the same symbols as used in FIG. 1 and their detail description is omitted. The fractional-N frequency synthesizer of the embodiment shown in FIG. 6 includes a random number generator 61 for receiving the frequency-divided, phase-compared signal fp as a clock signal and an adder 62, in addition to the structure of the embodiment of FIG. 1. Random numbers from the random number generator 61 are added to the fractional part F of the frequency divide ratio-setting value by the adder 62 and applied to the sigma-delta noise shaper 12. This further enhances the randomness of the integer sequence S delivered from the sigma-delta noise shaper 12. As a result, generation of spurious signals having periodically conspicuous spectral intensities is suppressed.

In the fractional-N frequency synthesizer of the present invention, spurious signals of periodically conspicuous spectral intensities are not produced essentially. In consequence, produced spurious signals can be canceled up to a practical level even with a spurious-canceling circuit that is not accurate. Therefore, the synthesizer can be fabricated relatively cheaply. In the present invention, the timing at which the spurious-canceling value is added is limited to the range closest to the output of the phase comparator, utilizing the period of the output signal frequency. This prevents deviation between the output timing of the phase comparator and the output timing of the spurious-canceling circuit so that spurious signals being caused by the deviation are suppressed.

What is claimed is:

1. A method of operating a fractional-N frequency synthesizer, comprising the steps of:
   preparing a sigma-delta noise shaper;
   setting integral and fractional parts of a frequency divide ratio-setting value for frequency-dividing an output signal;
   applying the fractional part of the frequency divide ratio-setting value to said sigma-delta noise shaper every phase comparison period;
   summing up an output from said sigma-delta noise shaper and the integral part of the frequency divide ratio-setting value to thereby create a sum;
   frequency-dividing the output signal, using this sum as a frequency divide ratio;
   producing a difference between the fractional part of said frequency divide ratio-setting value and the output from said sigma-delta noise shaper;
   accumulating said difference in an accumulator every phase comparison period; and
   producing a spurious-canceling value based on a value obtained from said accumulator.

2. A method as set forth in claim 1, further comprising the steps of:
   converting an output from said accumulator into an analog value; and
   adding said analog value to an output from a phase comparator, said output from the phase comparator being a phase difference between the output signal frequency-divided by said frequency divide ratio and a reference signal.

3. A method as set forth in claim 2, wherein timing at which said analog value and the output from said phase comparator are added up is restricted to a range close to output timing of said phase comparator.

4. A fractional-N frequency synthesizer having a voltage-controlled oscillator, a phase comparator, and a variable frequency divider mounted between said voltage-controlled oscillator and said phase comparator, said frequency synthesizer comprising:
   means for setting integral and fractional parts of a frequency divide ratio-setting value for frequency-dividing an output signal from said voltage-controlled oscillator by the variable frequency divider;
   a sigma-delta noise shaper to which said fractional part is applied every phase comparison period; and
   adder means for summing up an output from the sigma-delta noise shaper and said integral part to thereby produce a sum output;
   wherein the sum output from the adder means is used as a frequency divide ratio by the variable frequency divider, and wherein the output signal from said voltage-controlled oscillator is frequency-divided and supplied to said phase comparator.

5. A fractional-N frequency synthesizer as set forth in claim 4, further comprising:

means for creating a difference between the fractional part of said frequency divide ratio-setting value and the output from said sigma-delta noise shaper;

means for accumulating the difference every phase comparison period; and means for producing a spurious-canceling value based on the accumulated value.

6. A fractional-N frequency synthesizer as set forth in claim 5, wherein the means for producing said spurious-canceling value further includes: means for limiting the produced spurious-canceling value to a range close to output timing of said phase comparator based on the period of the output signal from said voltage-controlled oscillator; and adder means for adding the produced spurious-canceling value to the output from said phase comparator.

7. A fractional-N frequency synthesizer as set forth in claim 4, wherein there are further provided a random number generator and adder means for producing a sum of an output from the random number generator and the fractional part of said frequency divide ratio-setting value, and wherein said sum from the adder means is applied to said delta-sigma noise shaper.

* * * * *